(12) United States Patent
Henstra et al.

(10) Patent No.: US 12,362,132 B2
(45) Date of Patent: Jul. 15, 2025

(54) SIMPLE SPHERICAL ABERRATION CORRECTOR FOR SEM

(71) Applicant: FEI Company, Hillsboro, OR (US)

(72) Inventors: Alexander Henstra, Utrecht (NL); Ali Mohammadi-Gheidari, Best (NL)

(73) Assignee: FEI Company, Hillsboro, OR (US)

( * ) Notice: Subject to any disclaimer, the term of this patent is extended or adjusted under 35 U.S.C. 154(b) by 409 days.

(21) Appl. No.: 17/883,485

(22) Filed: Aug. 8, 2022

(65) Prior Publication Data

US 2024/0047169 A1     Feb. 8, 2024

(51) Int. Cl.
*H01J 37/153*     (2006.01)

(52) U.S. Cl.
CPC ..... *H01J 37/153* (2013.01); *H01J 2237/1534* (2013.01); *H01J 2237/28* (2013.01)

(58) Field of Classification Search
CPC ............ H01J 37/153; H01J 2237/1534; H01J 2237/28; H01J 37/12; H01J 37/28; H01J 2237/12; H01J 2237/1532; G01Q 30/02; G01Q 30/06
See application file for complete search history.

(56) References Cited

U.S. PATENT DOCUMENTS

| | | | |
|---|---|---|---|
| 4,414,474 A | 11/1983 | Crewe | |
| 6,630,677 B1 * | 10/2003 | Zhao | H01J 37/12 250/492.21 |
| 7,211,804 B2 | 5/2007 | Yoshida et al. | |
| 11,114,271 B2 | 9/2021 | Henstra et al. | |
| 2005/0017194 A1 | 1/2005 | Matsuya et al. | |
| 2011/0147605 A1 * | 6/2011 | Janzen | H01J 37/3177 250/396 R |
| 2021/0159044 A1 | 5/2021 | Henstra et al. | |
| 2024/0047170 A1 | 2/2024 | Mohammadi-Gheidari et al. | |

FOREIGN PATENT DOCUMENTS

| | | |
|---|---|---|
| EP | 2339608 B1 | 5/2014 |
| EP | 3005397 B1 | 10/2018 |

OTHER PUBLICATIONS

Partial European Search Report from European Application No. EP23190106, dated Jan. 3, 2024, 14 pp.
Extended European Search Report from European Application No. EP23189973, dated Jan. 3, 2024, 9 pp.
(Continued)

*Primary Examiner* — David E Smith
*Assistant Examiner* — Christopher J Gassen
(74) *Attorney, Agent, or Firm* — Klarquist Sparkman, LLP (57) ABSTRACT

Optical corrector modules for charged particle columns can include at least one split multipole that includes two multipoles separated by a distance less than 10 mm. Each of the individual multipoles may include at least two electrodes positioned to partially define a beam path through the multipole. Each of the electrodes can include a first surface that faces upstream of a charged particle beam when used in the charged particle column and a second surface that faces downstream of the charged particle beam when used in the charged particle column. The thickness between the first surface and the second surface for each of the electrodes may be less than 10 mm. The split multipoles may be electrostatic and may correspond to hexapoles.

20 Claims, 6 Drawing Sheets

(56) References Cited

OTHER PUBLICATIONS

Extended European Search Report from European Application No. EP23190106, dated May 10, 2024, 18 pp.
Haider et al., "Development of Aberration Correctors for the H D-2700, the HF3300S, the 1.2 MV First Program, and Future Prospects," Hitachi Review vol. 65 (2016), No. 7, 190-195, 6 pages.
Morishita et al., "Theoretical study on sixth-order geometrical aberration correction," Ultramicroscopy, 239:113569 (2022), 6 pages.

* cited by examiner

SIMPLE SPHERICAL ABERRATION CORRECTOR FOR SEM

BACKGROUND OF THE INVENTION

Particle-optical microscopes utilize round lenses to direct electron/charged particle beams to irradiate a specimen. However, round lenses generate positive spherical aberration coefficient (Cs) that restrict higher opening angles and inhibit resolution and probe current. Over the years, many Cs-corrector systems have been developed to address spherical aberration in microscope systems, such as transmission electron microscopes (TEMs) and scanning transmission electron microscopes (STEMs).

However, Cs-correctors have been difficult to successfully implement in scanning electron microscope (SEM) columns due to their difficulty to manufacture such correctors, and their exorbitant manufacturing costs. This is because, present Cs-corrector designs used in S(T)EM systems require many additional component elements which can be difficult hence expensive to manufacture. These many additional elements and excitations are usually needed to nullify the parasitic aberrations which are caused by mechanical errors inherent to the ordinary component fabrication techniques. This makes, the costs of such techniques exceed the budgets of most SEM users. Because these factors have resulted in the costs for many current Cs-correctors for SEM systems exceeding the cost of the SEM columns themselves, it is desired to find a simpler and more compact Cs-corrector systems (e.g., with fewer pieces that are easier to manufacture) which are capable of correcting for spherical aberrations in a SEM optical column. Moreover, additional cost reduction can be perceived if one also uses very accurate fabrication techniques such as MEMS technology.

SUMMARY OF THE INVENTION

Compact corrector for correcting spherical aberration of a particle-optical lens in a charged particle microscope system, according to the present disclosure a first multipole element (e.g., a 6-pole element, an 8-pole element, a 12-pole element, etc.) configured to generate a strong hexapole field when a first voltage is applied to it, and a second multipole element configured to generate a weak hexapole field that is positioned between the first multipole element and a sample when the corrector module is used in the charged particle microscopy system. According to the present invention, the strong hexapole is positioned such that the crossover of a charged particle beam of the charged particle system does not pass through the center of the first multipole element (i.e., the strong hexapole), such that the first multipole element field applies at least an A2 aberration and a D4 aberration to the charged particle beam. The second multipole element is further positioned or otherwise configured such that, when a second voltage is applied to the second multipole element the weak hexapole field it generates applies at least a combination A2 aberration and a combination D4 aberration to the charged particle beam of the charged particle microscopy system. In this way, the net combination of the aberrations applied to the charged particle beam by the weak and strong hexapole fields result in the beam having a desired A2, C3, and D4 aberrations at or near the sample plane.

Additionally, charged particle systems including compact correctors according to the present disclosure include a sample holder configured to hold a sample, a charged particle source configured to emit a charged particle beam towards the sample, an optical column configured to direct the charged particle beam such that it is incident on the sample, and a detector system configured to detect emissions resultant from the sample being irradiated by the charged particle beam. The optical column includes the compact corrector module which comprises a first multipole (i.e., strong hexapole) configured to generate a strong hexapole field when a first voltage is applied to it, and a second multipole (i.e., weak hexapole) positioned between the strong hexapole and the sample. The strong hexapole is positioned such that the crossover of the charged particle beam does not pass through the center of the strong hexapole causing the strong hexapole field to apply at least an A2 aberration and a D4 aberration to a charged particle when a second voltage is applied to the weak hexapole it generates a weak hexapole field that applies at least a combination A2 aberration and a combination D4 aberration to the charged particle beam;

Moreover, optical corrector modules for charged particle columns which comprise split multipoles, according to the present invention include at least one split multipole composed of two multipoles (e.g., wafer multipoles, magnetic multipole, electrostatic multipole, etc.) separated by a distance less than any of 100 mm, 10 mm, 1 mm, 100 μm, and 10 μm. Each of the individual multipoles comprise at least two electrodes positioned to partially define a beam path through the multipole. According to the present invention, each of the electrodes comprises: a first surface that faces upstream of a charged particle beam when used in the charged particle column; and a second surface that faces downstream of the charged particle beam when used in the charged particle column, wherein the thickness between the first surface and the second surface for each of the electrodes is less than 3 mm. Within the scope of the disclosure, the split multipoles may be electrostatic and may correspond to hexapoles.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Compact corrector system for correcting the spherical aberration of a particle-optical lens in charged particle microscope systems, including but not limited to SEM, STEM, TEM, and FIB, are disclosed herein. Specifically, the systems disclosed herein uses multipoles (such as, but not limited to electromagnetic multipoles, the electrostatic multipoles, split multipoles, etc.) to correct for A2, C3, and/or D4 aberrations. An example corrector system according to the present disclosure includes a strong hexapole that is positioned such that its center is misaligned with the crossover of the beam (e.g., either the strong hexapole is positioned within the system, the beam is manipulated, or a combination thereof, such that the center of the strong hexapole is positioned 0.1-2 mm from a location of a crossover of the beam), and a weak hexapole (e.g., 10×, 50×, 100×, etc. smaller than the strong hexapole) is positioned downstream of the strong hexapole. According to the present invention, the misalignment of the strong hexapole is in the direction of the weak hexapole. Because of this displacement, when a first voltage is applied to the strong hexapole it generates a strong hexapole field when a first voltage is applied to it, and a weak hexapole positioned between the strong hexapole and a sample when the corrector module is used in the charged particle microscopy system.

According to the present invention, the strong hexapole is positioned such that the crossover of a charged particle beam of the charged particle system does not pass through the center point of the strong hexapole (i.e., does not pass within 0.1, 0.2, 0.5, 1 mm, 1.2 mm, 1.5 mm, or 2 mm distance of the center of the strong hexapole), such that the strong hexapole field applies at least an A2 aberration and a D4 aberration to the charged particle beam. A second voltage may then be applied to the weak hexapole such that it generates a weak hexapole field that applies at least a combination A2 aberration and a combination D4 aberration to the charged particle beam of the charged particle microscopy system. In some embodiments, the weak and strong hexapoles may be positioned, charged, or otherwise configured such that the two hexapole fields further apply combination C3 aberrations to the beam. In this way, the net combination of the aberrations applied to the charged particle beam by the weak and strong hexapole fields can be adjusted so that the charged particle beam has a desired A2, C3, and/or D4 aberrations at or near the sample plane. By doing so, compact corrector according to the present disclosure are able to improve the resolution of charged particle microscopes. For example, the compact correctors according to the present disclosure are able to improve the resolution of 30 kV beam SEM optical columns by a factor of at least 2.5×.

The present disclosure further describes various types of corrector systems disclosed that include split multipoles. Split multipoles are comprised of two hexapoles separated by a distance (e.g., less than 20 mm), where the multipoles are each composed of two or more electrodes having a thickness of less than 10 mm, 5 mm, 3 mm, or 1 mm. For example, where the multiples are wafer multipoles, such wafer multipoles are each composed of two or more electrodes having a thickness between 1 and 100 μm. In some embodiments, such wafer hexapoles may correspond to and/or be constructed using the systems and methods disclosed in U.S. patent Ser. No. 17/883,495 titled CHARGED PARTICLE OPTICS COMPONENTS AND THEIR FABRICATION and filed on Aug. 8, 2022, which is hereby incorporated by reference in its entirety. Split multipoles are configured to generate a strong multipole field when a voltage (e.g., 100V-300 kV) is applied to each of the wafer multipoles. By applying a same voltage to each of the multipoles, the combined electromagnetic fields generated by the two multipoles combine to provide the effect of a strong multipole. Because split multipoles are composed of multipoles, the split multi pole can be used to correct aberrations in charged particle beams having energies of more than 10 KeV.

Figure 1:
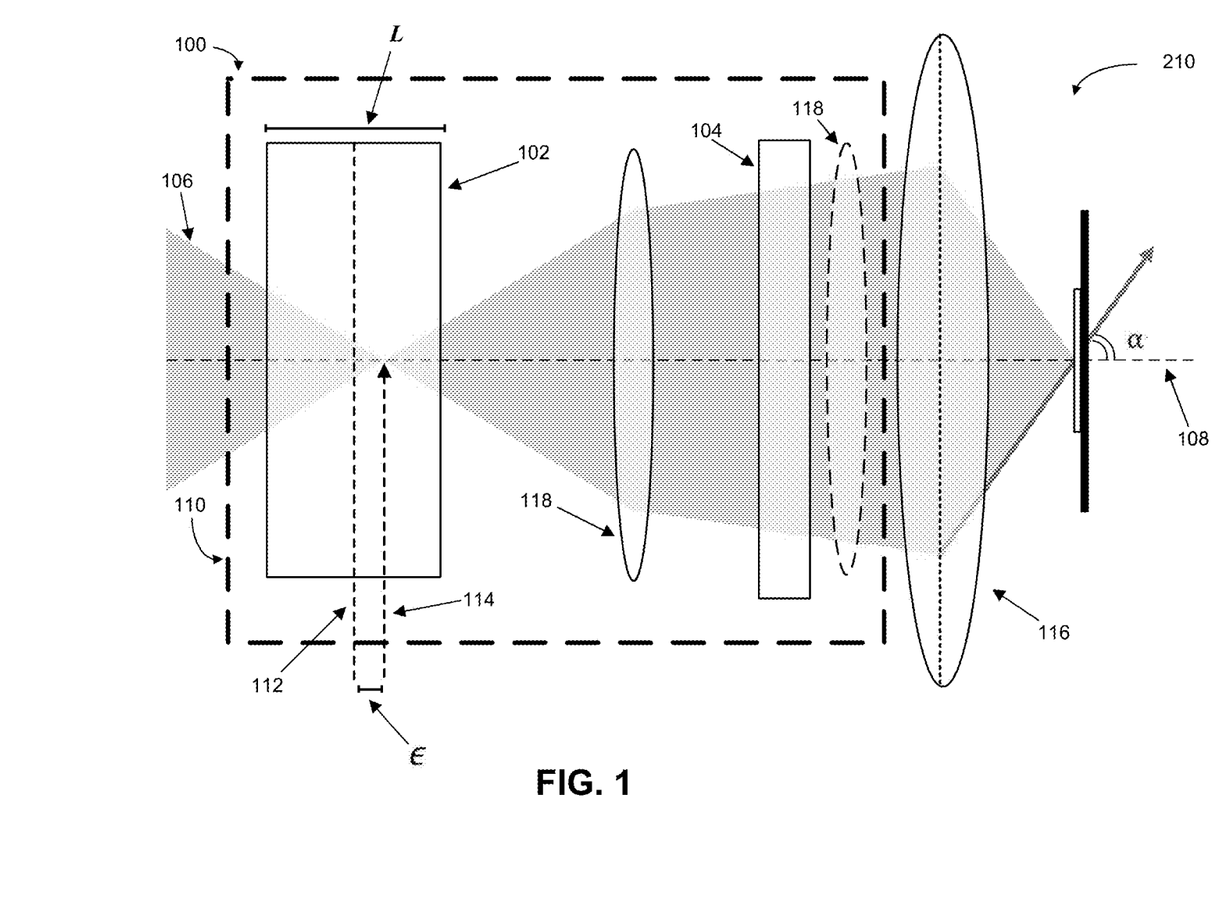
FIG. 1 illustrates example compact correctors for correcting the A2, C3, and/or D4 aberrations at or near the sample plane, according to the present invention.
Figure 9:
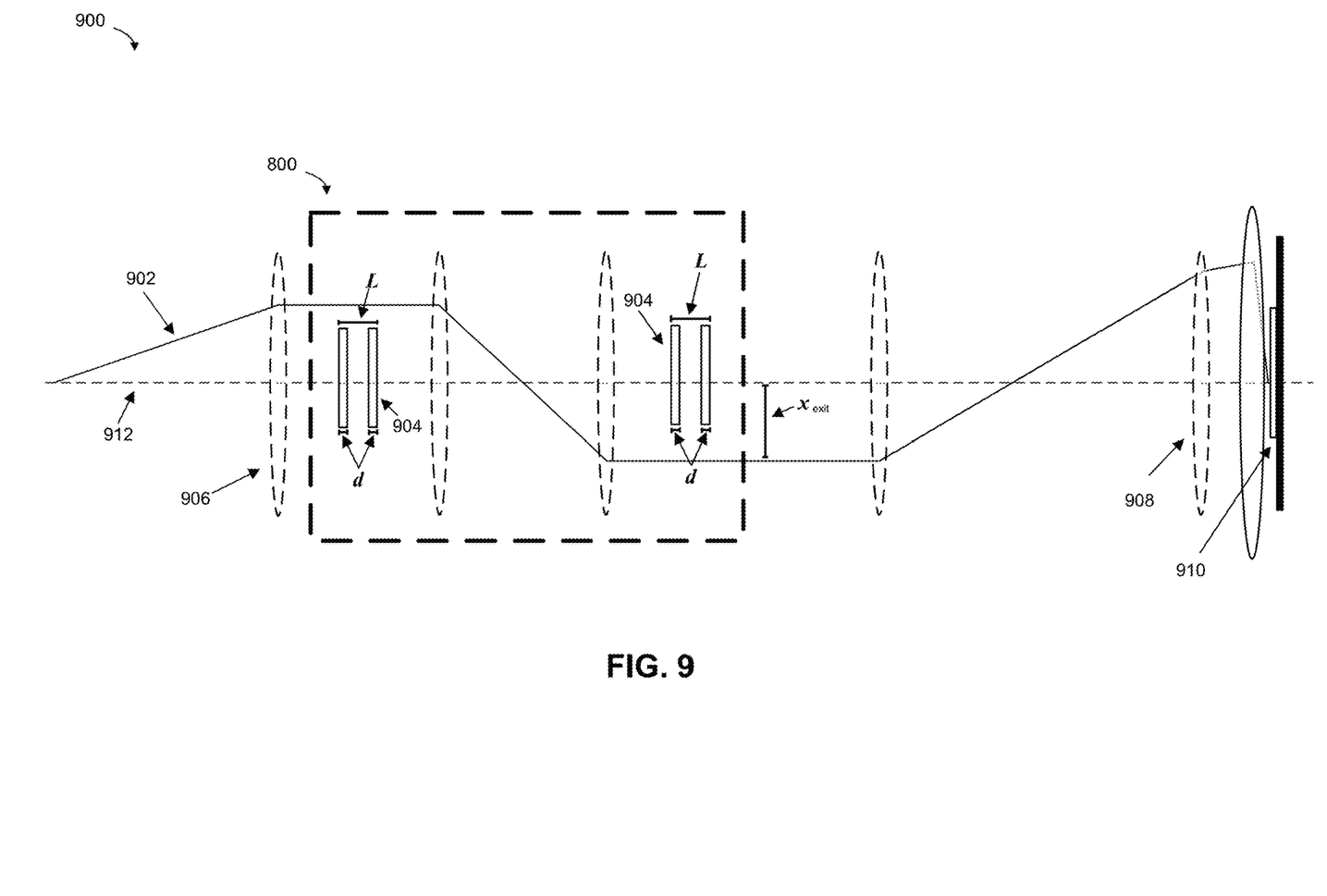
FIG. 9 is a diagram that illustrates the optical behavior of Rose type corrector that comprises two split hexapoles according to the present disclosure.

FIG. 1 is an illustration of example compact correctors 100 for correcting the A2, C3, and/or D4 aberrations at or near the sample plane, according to the present invention. Example compact multipole correctors 100 include a strong hexapole 102 (e.g., a first 6-pole, 8-pole, or 12-pole element) having an effective length L which is configured to generate a strong hexapole field when a first voltage is applied to it, and a weak hexapole 104 (e.g., a second 6-pole, 8-pole, or 12-pole element) positioned downstream of the strong hexapole 102 when used in a charged particle system that is configured to generate a weak hexapole field when a second voltage is applied to it. The strength and/or orientation of the strong hexapole and the weak hexapole can be adjusted to allow for a desired value of contribution of their generated fields to A2, C3, and/or D4. In various embodiments, the strong hexapole 102 may be an electrostatic multipole having a length within the range of 0.01-10 mm (e.g., at least 5 mm), and the first voltage may be between 0.1 kV and 30 kV. Moreover, the weak hexapole 104 is at least 30×, 50×, or 100× weaker than the strong hexapole 102. As shown in FIG. 9, in some embodiments the strong hexapole 102 may be a split hexapole comprised of two hexapoles separated by a distance less than any of 100 mm, 10 mm, 1 mm, 100 μm, and 10 μm. Such multipoles are composed of two or more electrodes having a thickness of less than 10 mm, 5 mm, 3 mm, or 1 mm.

During operation of the charged particle system comprising the compact corrector 100, a charged particle beam 106 is directed along a central axis 108 toward a first end 110 of the compact corrector. According to the present invention, the weak hexapole 104 is positioned, excited, and/or otherwise configured such that the weak hexapole field combines with the strong hexapole field to create a combination aberration that applies one or more of a A2, C3, and/or D4 aberration effect to the charged particle beam as it passes through the corrector 100. According to the present invention, the contributions of the strong hexapole field to one or more of the A2, C3, and/or D4 aberrations and this combination aberration effect generated by the combination of the strong hexapole field and the weak hexapole field may be such that the net result of the contributions of the strong hexapole field and the combination aberration effect with regard to one or more of the A2, C3, and/or D4 aberrations are such that such that the value of one or more of the A2, C3, and/or D4 aberrations in the charged particle 106 at or near the sample plane have a desired value. In some embodiments, this may result in the charged particle beam 106 having zero or near zero A2, C3, and/or D4 aberrations when it leaves the corrector 100. Alternatively, or in addition, the corrector may cause the charged particle beam 106 to have desired A2, C3, and/or D4 aberrations values when it leaves the corrector 100 which combine with other aberration effects of the other optical elements downstream of the corrector 100 within a charged particle system such that a desired value of the A2, C3, and/or D4 aberrations is present in the charged particle beam 106 at the sample plane.

In prior art correctors, the component multipoles are positioned at crossovers of charged particle beams so as to prevent an aberration. However, in the example compact correctors 100, the strong hexapole 102 is positioned, or the charged particle beam 106 is adjusted, or a combination thereof, such that a displacement $\epsilon$ exists between the center 112 of the strong hexapole and a crossover 114 of the charged particle beam. Because the strong hexapole 102 is misaligned with the charged particle beam crossover 114 in this way, the contribution of the strong hexapole field to the charged particle beam 106 A2, C3, and D4 aberrations. Specifically, contributions of the strong hexapole field contributes to each of A2, C3, and D4 aberrations to the charged particle beam 106 are each a function of displacement $\epsilon$. For example, in a model compact corrector 100 where the hexapoles are magnetic hexapoles, using the Hamilton equations the back extrapolated contribution to each of the A2, C3, and D4 aberrations by the corrector at position 114 can be shown as:

$$A2 = \frac{1}{4}kL^3\epsilon + kL\epsilon^3 \qquad (1)$$

$$C3 = \frac{-1}{336}k^2L^7 - \frac{1}{24}k^2L^6\epsilon - \frac{2}{3}k^2L^4\epsilon^3 - \frac{1}{3}k^2L^3\epsilon^4 - 2k^2L^2\epsilon^5 \qquad (2)$$

$$D4 = \frac{k^3L^{10}}{8064} + \left(\frac{kL^3}{8} + \frac{k^3L^9}{1008}\right)\epsilon + \frac{1}{672}k^3L^8\epsilon^2 + \qquad (3)$$

$$\left(\frac{kL}{2} + \frac{55k^3L^7}{1008}\right)\epsilon^3 + \frac{1}{18}k^3L^6\epsilon^4 + \frac{7}{15}k^3L^5\epsilon^5 + \frac{1}{3}k^3L^4\epsilon^6 + k^3L^3\epsilon^7$$

Moreover, in a second example, in a model compact corrector 100 where the hexapole 102 is electrostatic, the back extrapolated contribution to each of the A2, C3, and D4 aberrations by the corrector at position 114 can be shown as:

$$A2 = \frac{1}{4}kL^3\epsilon + kL\epsilon^3 \qquad (4)$$

$$C3 = \frac{-1}{336}k^2L^7 - \frac{1}{24}k^2L^6\epsilon - \frac{2}{3}k^2L^4\epsilon^3 - \frac{1}{3}k^2L^3\epsilon^4 - 2k^2L^2\epsilon^5 \qquad (5)$$

$$D4 = \frac{k^3L^{10}}{8064} + \left(\frac{kL^3}{6} + \frac{k^3L^9}{1008}\right)\epsilon + \frac{1}{672}k^3L^8\epsilon^2 + \qquad (6)$$

$$\left(\frac{2kL}{3} + \frac{55k^3L^7}{1008}\right)\epsilon^3 + \frac{1}{18}k^3L^6\epsilon^4 + \frac{7}{15}k^3L^5\epsilon^5 + \frac{1}{3}k^3L^4\epsilon^6 + k^3L^3\epsilon^7$$

A person having skill in the art would understand from (1)-(6) how the characteristics of the strong hexapole 102 (i.e., the first voltage, L, k, etc.) and the value of displacement $\epsilon$ in such an example system may affect or otherwise induce A2, C3, and D4 aberrations in a 106 charged particle beam as it passes through the strong hexapole 102. Persons having skill in the art would understand how a subsequent lens 118 and/or the weak hexapole 104 can be designed, positioned, or otherwise tuned such that the resultant values of the A2, C3, and/or D4 aberrations of the charged particle beam 106 may have a desired value in the sample plane.

For example, the displacement $\epsilon$ may be adjusted such that each of the A2, C3, and/or D4 aberrations can have desired non-zero or zero values at the sample plane. In another example, the dimensions, positions, and excitations of the subsequent lens 118 and the weak hexapole 104 may be selected so that their contributions to the A2, C3, and D4 aberrations in the charged particle beam 106 combine with the corresponding contributions of the strong hexapole 104 to the charged particle beam such that A2 and D4 are nearly zero. In such embodiments, the characteristics of the strong hexapole 102, weak hexapole 104, and/or the lens 118 may be tuned such that the slight negative spherical aberration present in the charged particle beam 106 after passing through the corrector 100 compensates for contribution of the objective lens 116 to the spherical aberration of the charged particle beam. In the equations above, k is the strength of the strong hexapole and L is the effective length of the hexapole.

FIG. 1 illustrates the weak hexapole as being proximate to an objective lens 116 of the charged particle system. In some embodiments, the weak hexapole 104 may be positioned within the field of the objective lens 116 of the charged particle system, and/or within the objective lens 116 of the charged particle system itself. However, a person having skill in the art would understand that according to the present invention the weak hexapole 104 may be placed at any location between the strong hexapole 102 and a sample under investigation so long as (1) it is able to affect the beam 106 striking the sample, and (2) the voltages applied to the weak hexapole 104 and/or the strong hexapole 102 are adjusted such that the A2, C3, and/or D4 contributions by each of their corresponding hexapole fields combine to result in a desired net A2, C3, and/or D4 contribution to the beam 106.

Moreover, while not pictured in FIG. 1, the weak hexapole 104 may be positioned either upstream or downstream of a microscope beam scanning system (e.g., AC scan unit). For example, in an embodiment the weak hexapole 104 may be positioned downstream of the microscope scanning unit and configured to dynamically adjust the hexapole field it creates based on the path of the beam through the weak hexapole 104. Additionally, in some embodiment of the present invention the weak hexapole 104 may be able to be dynamically tuned based on one or more components of the microscope system in which it is used. For example, the weak hexapole 104 may be tunable to compensate for a beam rotation created by a lens in such a microscope system.

FIG. 1 further illustrates the compact corrector 100 as including optional transfer lens(es) 118 positioned between the strong hexapole 102 and the weak hexapole 104 and downstream of the weak hexapole. However, embodiments of the corrector system 100 may include only one of these transfer lenses, additional transfer lenses, or no such transfer lens. For example, in embodiments of the present invention the corrector 100 may include a round lens 118 positioned between the strong hexapole and the weak hexapole which is positioned, charged, or otherwise configured to apply a lensing effect to the charged particle beam such that the magnitude of the D4 aberration in the charged particle beam 106 is influenced to allow the charged particle beam to have a desired value of the D4 aberration in the sample plane. In FIG. 1, multipole corrector 100 is illustrated as being a box comprising a plurality of optical components (i.e., multipoles and lenses). In various embodiments, these optical components may be encased or partially encased by a protective and/or supporting structure. Additionally, in embodiments including such a structure, one or more of the optical components may be not within such a structure.

Figure 2:
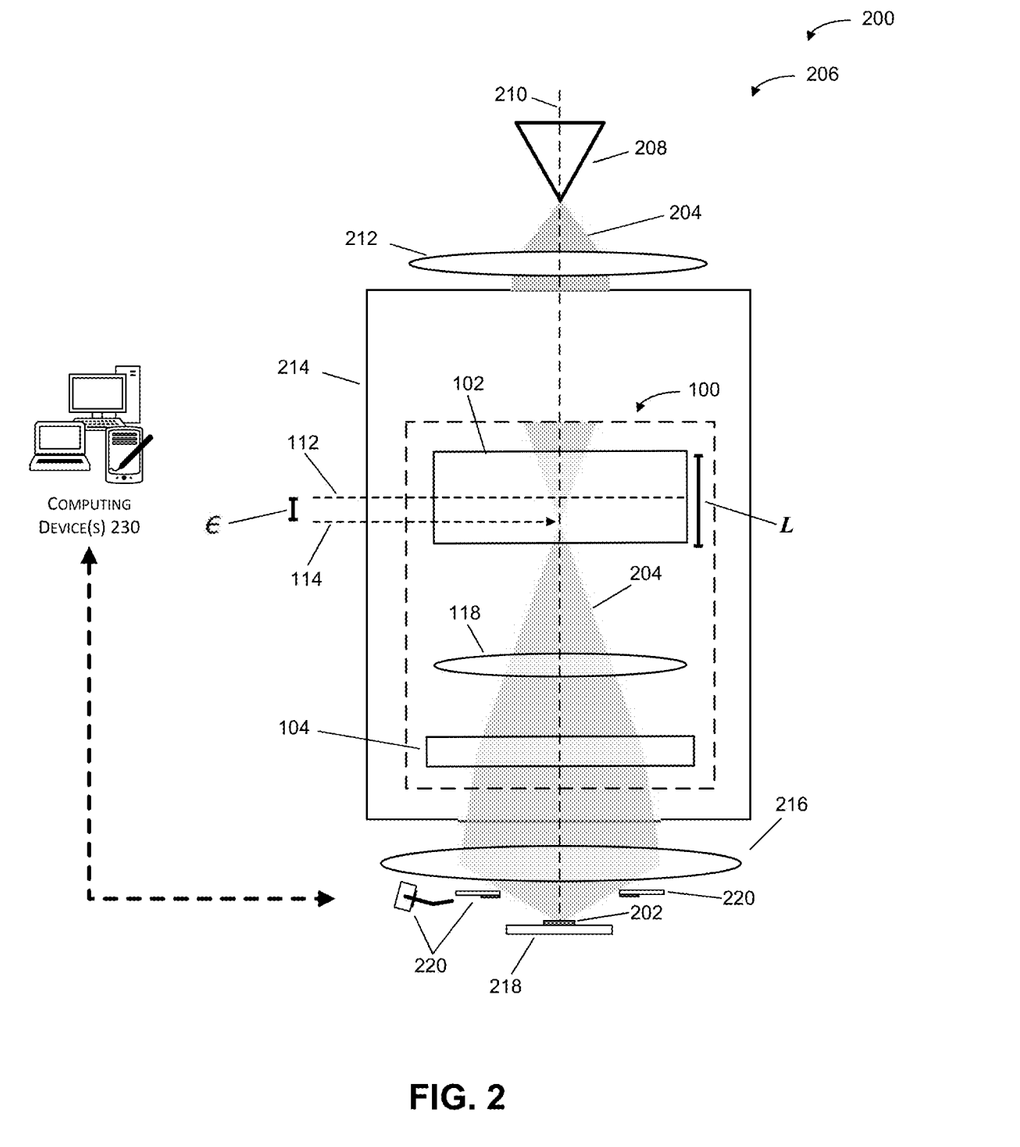
FIG. 2 illustrates an example charged particle microscope system(s) for inspection of a component of a sample whose optical column includes a compact correctors for correcting the A2, C3, and/or D4 aberrations at or near the sample plane, according to the present invention.

FIG. 2 is an illustration of example charged particle microscope system(s) 200 for inspection/imaging of a component of a sample 202 whose optical column includes a compact corrector 100 for correcting the A2, C3, and/or D4 aberrations at or near the sample plane, according to the present invention. The example charged particle microscope system(s) 200 may include electron microscope (EM) setups or electron lithography setups that are configured to irradiate and/or otherwise impinge the sample 202 with a beam of electrically charged particles 204 (usually an electron beam or an ion beam). In various embodiments the charged particle microscope system 200 may be or include one or more different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc. Additionally, in some embodiments a TEM is capable of operating as a STEM as well. FIG. 2 shows the example charged particle microscope system(s) 200 as being a SEM system 206. However, as the compact correctors 100 according to the present invention may be composed of electrostatic hexapoles that are able to accept a wide range of excitations (e.g., including but not limited to 50 kV and 300 kV), the compact correctors are capable for correcting the A2, C3, and/or D4 in TEM and STEM systems.

The example charged particle microscope system(s) 200 includes a charged particle source 208 (e.g., a thermal electron source, Schottky-emission source, field emission source, a liquid metal ion source, a plasma ion source, etc.) that emits the charged particle beam 204 along an emission axis 210 and towards an accelerator lens 212. The emission axis 210 is a central axis that runs along the length of the example charged particle microscope system(s) 200 from the charged particle source 208 and through the sample 202.

The accelerator lens 212 accelerates/decelerates, focuses, and/or directs the charged particle beam 204 towards a focusing column 214. The focusing column 214 focuses the charged particle beam 204 so that it is incident on sample 202. Additionally, the focusing column 214 corrects and/or tunes aberrations (e.g., geometric aberrations, chromatic aberrations) of the charged particle beam 204.

In FIG. 2, the focusing column 214 is illustrated as including compact correctors 100 for correcting the A2, C3, and/or D4 aberrations at or near the sample plane according to the present invention. That is, FIG. 2 illustrates charged particle microscope system(s) 200 that include a SEM multipole corrector system 100 that comprises a strong hexapole 102 and a weak hexapole 104, where the center of the strong hexapole 112 is displaced from an axial crossover 114 of a charged particle beam by a displacement $\in$. The strong hexapole 102 may configured to generate a strong hexapole field when a first voltage is applied to it, and the weak hexapole 104 may be configured to generate a weak hexapole field when a second voltage is applied to it. In some embodiments, the strong hexapole 102 may be a split hexapole comprised of two wafer hexapoles separated by a distance less than any of 100 mm, 10 mm, 1 mm, 100 μm, and 10 μm. A person having skill in the art would understand how, the weak hexapole 104 may be positioned, excited, and/or otherwise configured such that the weak hexapole field makes a contribution to one or more of the A2, C3, and/or D4 aberrations in the charged particle beam 204 that are combination to the strong hexapole field's contributions to one or more of the A2, C3, and/or D4 aberrations in the charged particle beam 204. In this way, by adjusting the positioning and excitation of the weak hexapole 104, the contributions of the weak hexapole field to one or more of the A2, C3, and/or D4 aberrations may be such that they combine with the contributions of the strong hexapole field to cause the charged particle beam 204 to have a desired A2, C3, and/or D4 aberrations at or near the sample plane.

The objective lens 216 is an optical element that focuses the charged particle beam 204 to a point on the sample 202. The objective lens 216 may comprise a single-polepiece lens, a magnetic electrostatic compound lens, electrostatic detector objective lens, or another type of objective lens. An additional benefit of the compact correctors 100 according to the present invention is that they allow for an increased opening angle of the charged particle beam. For example, an example compact correctors 100 can allow for the opening angle of the charged particle beam to be greater than 20 mrads.

FIG. 2 further illustrates the example charged particle microscope system(s) 200 as including a sample holder 218 that holds the sample 202. The example charged particle microscope system(s) 200 is also shown as including detector systems(s) 220 that are configured to detect emissions from the sample 202 resultant from the charged particle beam 204 being incident on the sample 202. In addition, while not shown in FIG. 2 the example charged particle microscope system(s) 200 may include astigmatism correction and/or scan coils for causing the charged particle beam 204 to scan the surface of the sample 202. For example, by operating scan coils, the direction of the charged particle beam 204 may be shifted so that it strikes a different location of the sample 202. A person having skill in the art would understand that in TEM or(S) TEM systems, the detector system 220 may also include and/or consist of one or more detectors positions below the sample.

FIG. 2 further shows example charged particle microscope system(s) 200 as optionally including a computing device(s) 230. Those skilled in the art will appreciate that the computing devices 230 depicted in FIG. 2 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 230 may also be connected to other devices that are not illustrated, or instead may operate as a stand-alone system.

Figure 3:
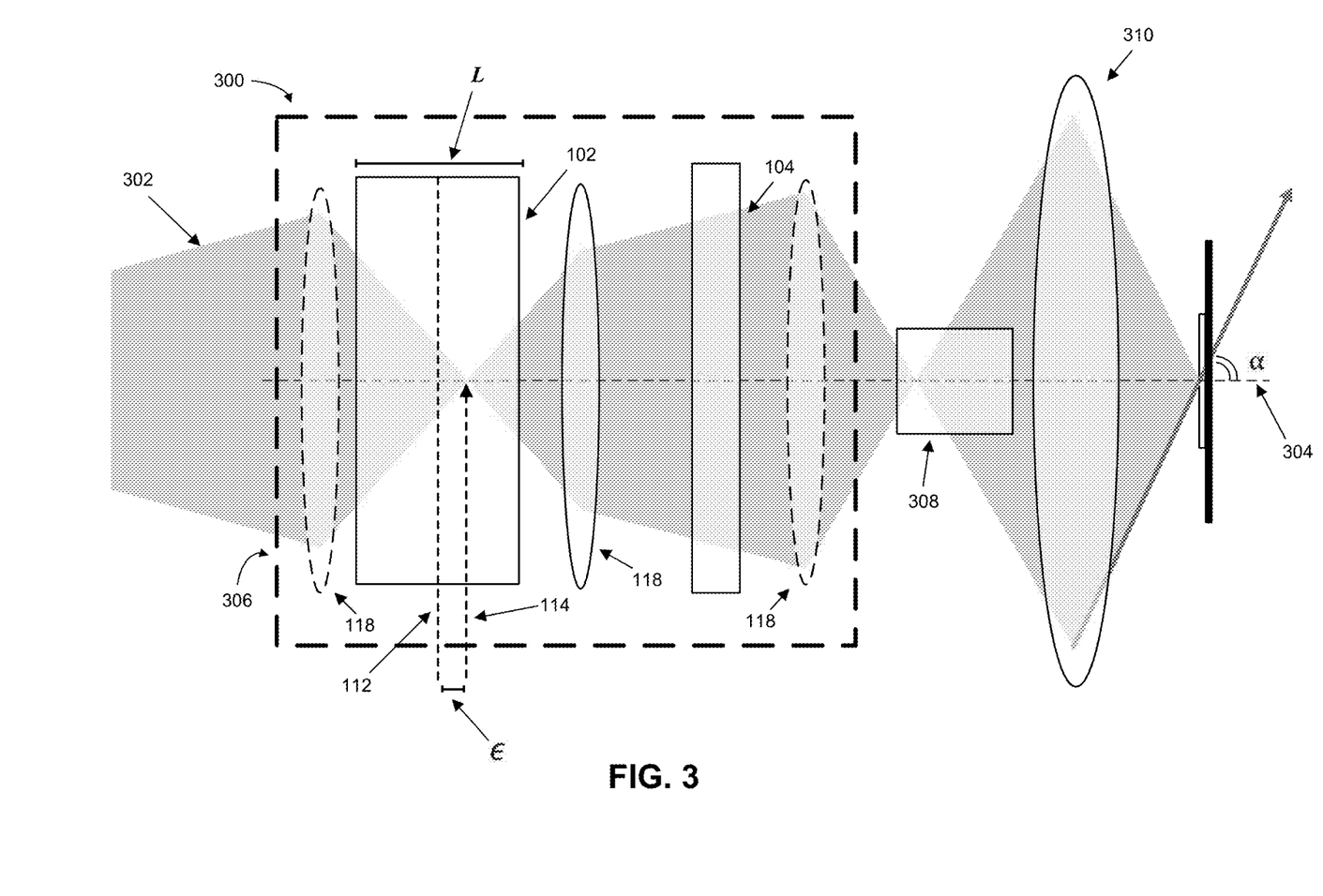
FIG. 3 illustrates an alternate embodiment example compact correctors for correcting the A2, C3, and/or D4 aberrations at or near the sample plane, according to the present invention.

FIG. 3 is an illustration of an alternate embodiment of example compact correctors 300 for correcting the A2, C3, and/or D4 aberrations at or near the sample plane, according to the present invention. Example compact multipole correctors 300 include a strong hexapole 102 having an effective length L that is configured to generate a strong hexapole field when a first voltage is applied to it, and a weak hexapole 104 downstream of the strong hexapole 102 when used in a charged particle system that is configured to generate a weak hexapole field when a second voltage is applied to it. During operation of the charged particle system comprising the compact corrector 300, a charged particle beam 302 is directed along a central axis 304 toward a first end 306 of the compact corrector 300.

FIG. 3 further illustrates the compact corrector 300 as including optional transfer lens(es) 118 positioned on each side of the strong hexapole 102, and downstream of the weak hexapole 104. While in some embodiments an AC scan unit may be placed upstream of the weak hexapole 104, FIG. 3 illustrates an embodiment where an AC scanning unit 308 is positioned between the compact corrector 300 and an objective lens 310 of the microscope system.

Figure 4:
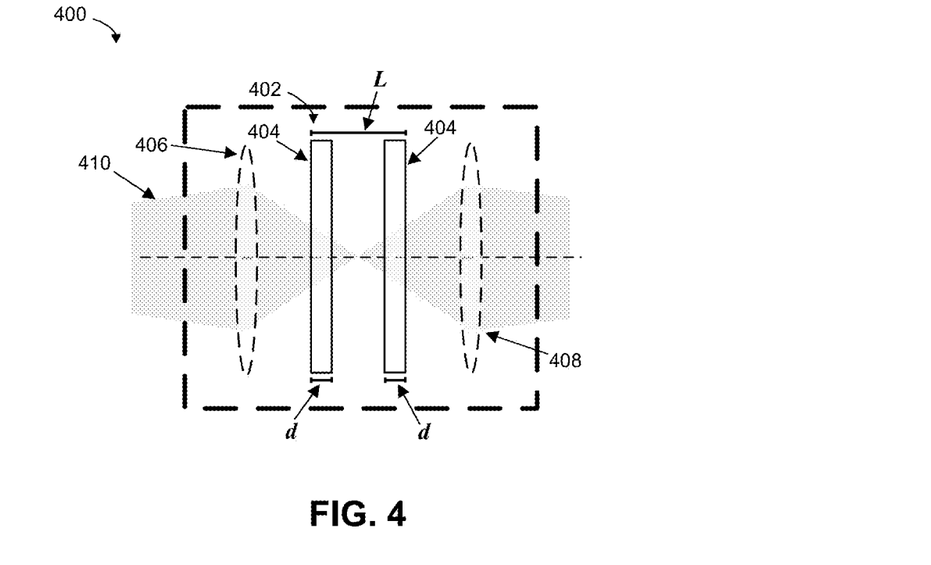
FIG. 4 illustrates an example Crewe corrector comprising a single split multipole, according to the present disclosure.

FIG. 4 shows an example Crewe corrector 400 comprising a single split multipole, according to the present disclosure. Specifically, FIG. 4 depicts a Crewe style Hexapoles Cs-corrector. As discussed above, in some embodiments a strong multipole may correspond to a split multipole 402 be comprised of two wafer hexapoles 404 having a thickness d and which are separated by a distance (e.g., less than 20 mm). According to the present invention, no optical components (lenses, multipoles, etc.) are positioned between the component wafer multipoles 404 for the split multipole. Where the split multipole 402 has a length of L, the separation can thus be written as L−2d. The wafer multipoles are composed of two or more electrodes having a thickness of less than 10 mm, 5 mm, 3 mm, or 1 mm.

FIG. 4 illustrates the Crewe corrector 400 as further comprising a first transfer lens 406 and a second transfer lens 408, where the first transfer lens 406 applies a focusing effect to a charged particle beam 410 passing through the corrector 400 that causes a crossover of the charged particle beam between the component two wafer multipoles 404 of the split multipole 402. While FIG. 4 shows the crossover as being equidistant to each component wafer multipole, in other embodiments (such as the embodiment depicted in FIG. 5) the first transfer lens 406 may be configured to apply a focusing effect that causes the crossover of the charged particle beam 410 to not be equidistant to each component wafer multipole 404.

Figure 5:
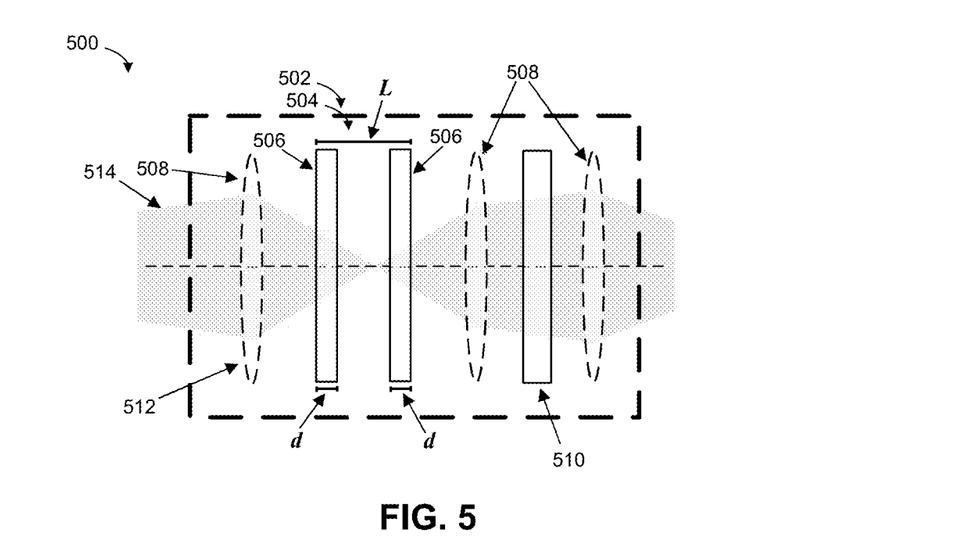
FIG. 5 illustrates an example corrector as described in association with FIGS. 1-3, where the strong hexapole corresponds to a split composed of two hexapoles.

FIG. 5 shows an example corrector 500 as described in association with FIGS. 1-3, where the strong hexapole 502 corresponds to a split hexapole 504 composed of two wafer hexapoles 506. FIG. 5 shows the corrector 500 as including three transfer lenses 508 and a weak hexapole 510. As discussed above, the initial transfer lens 512 applies a focusing effect to the charged particle beam 514 passing through the corrector 500 that causes a crossover that is not equidistant between the two wafer multipoles 506 of the split multipole 504. As discussed above, the weak hexapole 510 may be positioned, excited, and/or otherwise configured such that the weak hexapole field it generates makes a contribution to one or more of the A2, C3, and/or D4 aberrations in the charged particle beam 514 that are combination to the strong hexapole field's contributions to one or more of the A2, C3, and/or D4 aberrations in the charged particle beam 514. In this way, by adjusting the positioning and excitation of the weak hexapole 510, the contributions of the weak hexapole field to one or more of the A2, C3, and/or D4 aberrations may be such that they combine with the contributions of the strong hexapole field to cause the charged particle beam 514 to have a desired A2, C3, and/or D4 aberrations at or near a sample plane.

Figure 6:
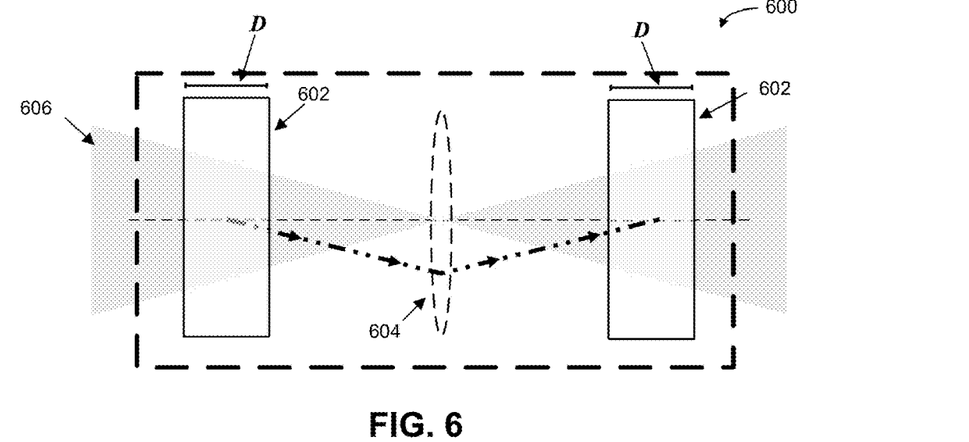
FIGS. 6 and 7 illustrate a prior art Crewe type corrector and a Crewe type corrector according to the present disclosure in which one or more of the hexapoles are split hexapoles, respectively.
Figure 7:
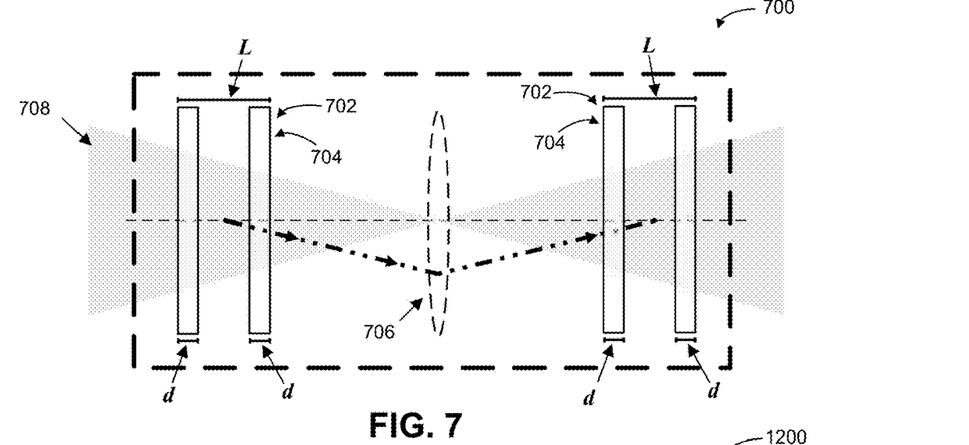

FIGS. 6 and 7 illustrate a Crewe type corrector 600 and a Crewe type corrector 700 according to the present disclosure in which one or more of the hexapoles are split hexapoles. Specifically, FIG. 6 shows a corrector that comprises two strong hexapoles 602 with a single transfer lens 604 positioned at an axial crossover of the charged particle beam 606 which is equidistant from the two hexapoles 602. However, as shown in FIG. 7, according to the present invention such Crewe type correctors can also be made with one or more split hexapoles. For example, FIG. 7 illustrates a Crewe type corrector 700 according to the present invention in which both strong hexapoles 702 are split hexapoles 704. However, a person having skill in the art would understand that in some embodiments only one of the strong hexapoles 702 may be split hexapoles 704. FIG. 7 also shows the corrector 700 as including a single transfer lens 706 positioned at an axial crossover of the charged particle beam 708 which is equidistant from the two split hexapoles 704.

Figure 8:
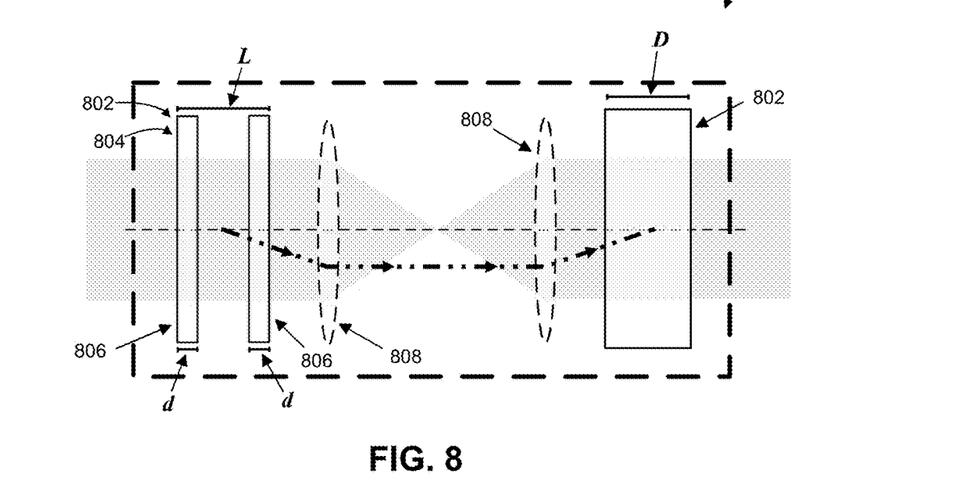
FIG. 8 illustrates a Rose type corrector that comprises at least one split hexapole.

FIG. 8 illustrates a Rose type corrector 800 that comprises at least one split hexapole. Specifically, FIG. 8 illustrates a Rose type corrector where one of the two strong hexapoles 802 corresponds to a split hexapole 804 composed of two wafer multipoles 806. However, a person have skill in the art would understand how corrector 800 could be constructed with both strong hexapoles 802 corresponding to split hexapoles 804. Corrector 800 is shown as having two transfer lenses 808 positioned between the split hexapoles 804.

FIG. 9 is a diagram 900 that illustrates the optical behavior of Rose type corrector 800 that comprises two split hexapoles according to the present disclosure. Specifically, diagram 900 illustrates the optical behavior for considering aberrations present in a Rose type corrector 800 comprising two split hexapoles. FIG. 9 shows the behavior of an axial ray 902 passing through an example Rose type corrector 800 in which the two hexapoles are electrostatic split hexapoles 904 according to the present invention. Specifically, FIG. 9 shows the split hexapoles 904 as having a length L and being composed of two wafer hexapoles having a thickness of d, where a same charge is applied to each of the wafer hexapoles. For example, where the thickness of the wafer hexapoles is 2 mm, the length of the split hexapole may be 12 mm, and the voltage applied to each wafer hexapoles may be ±170V. In various embodiments, the split hexapoles 904 may be configured to generate small dipole and/or quadrupole fields in addition to hexapole fields. While not limiting to the present disclosure, a person having skill in the art would understand the corrector strength of the Rose type corrector 800 as corresponding to $$C_{3s} = 4k^2 d^2 \left(L - \frac{2}{3}d\right), \text{ with } k = \frac{3\gamma_r}{2U_r} \frac{V_{hex}}{R^3}. \tag{6}$$

FIG. 9 further shows a condenser lens 906 positioned upstream of the Rose type corrector 800, and an objective lens 908 configured to focus the charged particle beam onto a sample 910. The axial ray 902 is illustrated as exiting the Rose type corrector 800 as being parallel to the optical axis 912 and being positioned $x_{exit}$ distance from the optical axis 912.

While FIGS. 4-9 show split multipoles being included within a number of example corrector systems, a person having skill in the art would understand how the split multipole technology described herein may be included in other corrector systems as a replacement for a any general multipole element where the produced secondary effect of the hexapole field is important.

Examples of inventive subject matter according to the present disclosure are described in the following enumerated paragraphs.

A1. A compact corrector module for a charged particle microscopy system, the corrector module comprising: a strong hexapole configured to generate a strong hexapole field when a first voltage is applied to it, wherein the strong hexapole is positioned such that the crossover of a charged particle beam of the charged particle system does not pass through the center of the strong hexapole causing the strong hexapole field to apply at least an A2 aberration and a D4 aberration to a charged particle beam of the charged particle microscopy system; and a weak hexapole positioned between the strong hexapole and a sample when the corrector module is used in the charged particle microscopy system, wherein when a second voltage is applied to the weak hexapole it generates a weak hexapole field that applies at least a combination A2 aberration and a combination D4 aberration to the charged particle beam of the charged particle microscopy system.

A1.1. The compact corrector module of paragraph A1, wherein the combined application of the A2 aberration and the combination A2 aberration to the charged particle beam results in the A2 aberration of the charged particle beam being at or near zero at or near the sample plane.

A1.2. The compact corrector module of any of paragraphs A1-A1.1, wherein the combined application of the D4 aberration and the combination D4 aberration to the charged particle beam results in the D4 aberration of the charged particle beam being at or near zero at or near the sample plane.

A1.3. The compact corrector module of any of paragraphs A1-A1.2, wherein the strong hexapole field further applies a C3 aberration to the charged particle beam of the charged particle microscopy system, and the weak hexapole field further applies a combination C3 aberration to the charged particle beam of the charged particle microscopy system.

A1.3.1. The compact corrector module of paragraph A1.3, wherein the combined application of the C3 aberration and the combination C3 aberration to the charged particle beam results in the C3 aberration of the charged particle beam being at or near zero at or near the sample plane.

A2. The compact corrector module of any of paragraphs A1-A1.3.1, wherein the second voltage is determined selected based on the distance between the crossover of the charged particle beam and the center of the strong hexapole.

A2.1. The compact corrector module of paragraph A2, wherein the second voltage is determined selected based on the distance between the crossover of the charged particle beam and the center of the strong hexapole such that one or more of the A2, C3, and D4 aberrations caused by the weak multipole field are combination to the A2, C3, and D4 aberrations caused by the strong multipole field.

A3. The compact corrector of any of paragraphs A1-A2.1, wherein the weak hexapole is at least 50 or 100 times weaker than the strong hexapole.

A4. The compact corrector of any of paragraphs A1-A3, wherein the weak hexapole is positioned within the objective lens when used in the charged particle system.

A5. The compact corrector of any of paragraphs A1-A4, wherein the weak hexapole is positioned within the field of the objective lens.

A6. The compact corrector of any of paragraphs A1-A5, wherein the charged particle microscope is one of a scanning electron microscope (SEM), a scanning transmission electron microscope (STEM), and a transmission electron microscope (TEM).

A7. The compact corrector of any of paragraphs A1-A6, wherein the strong hexapole is an electrostatic hexapole or an electromagnetic hexapole.

A7.1. The compact corrector of paragraph A7, wherein the strong hexapole has a (effective) length of at least 5 mm.

A8. The compact corrector of any of paragraphs A1-A7.1, wherein the corrector module is a probe corrector.

A9. The compact corrector of any of paragraphs A1-A8, further including a transfer lens positioned between the strong hexapole and the weak hexapole.

A9.1. The compact corrector of paragraph A9, further including an additional transfer lens positioned downstream of the weak hexapole.

A10. The compact corrector of any of paragraphs A1-A9, wherein the first voltage applied to the strong hexapole is between 50 and 300 kV.

A11. The compact corrector of any of paragraphs A1-A10, wherein the compact corrector module is configured to allow the opening angle of the charged particle beam of the charged particle microscopy to be greater than 20 mrads.

A12. The compact corrector of any of paragraphs A1-A11, further including a condenser lens positioned upstream of the strong hexapole when used in the charged particle system.

A13. The compact corrector of any of paragraphs A1-A12, wherein the compact corrector comprises only one strong hexapole.

B1. A charged particle system comprising: a sample holder configured to hold a sample; a charged particle source configured to emit a charged particle beam towards the sample; an optical column configured to direct the charged particle beam such that it is incident on the sample, the optical column including a compact corrector module that comprises: a strong hexapole configured to generate a strong hexapole field when a first voltage is applied to it, wherein the strong hexapole is positioned such that the crossover of the charged particle beam does not pass through the center of the strong hexapole causing the strong hexapole field to apply at least an A2 aberration and a D4 aberration to a charged particle beam; and a weak hexapole positioned between the strong hexapole and the sample, wherein when a second voltage is applied to the weak hexapole it generates a weak hexapole field that applies at least a combination A2 aberration and a combination D4 aberration to the charged particle beam; and a detector system configured to detect emissions resultant from the sample being irradiated by the charged particle beam.

B1.1. The compact corrector module of paragraph B1, wherein the combined application of the A2 aberration and the combination A2 aberration to the charged particle beam results in the A2 aberration of the charged particle beam being at or near zero at or near the sample plane.

B1.2. The compact corrector module of any of paragraphs B1-B1.1, wherein the combined application of the D4 aberration and the combination D4 aberration to the charged particle beam results in the D4 aberration of the charged particle beam being at or near zero at or near the sample plane.

B1.3. The compact corrector module of any of paragraphs B1-B1.2, wherein the strong hexapole field further applies a C3 aberration to the charged particle beam of the charged particle microscopy system, and the weak hexapole field further applies a combination C3 aberration to the charged particle beam of the charged particle microscopy system.

B1.3.1. The compact corrector module of paragraph B1.3, wherein the combined application of the C3 aberration and the combination C3 aberration to the charged particle beam results in the C3 aberration of the charged particle beam being at or near zero at or near the sample plane.

B2. The compact corrector module of any of paragraphs B1-B1.3.1, wherein the second voltage is determined selected based on the distance between the crossover of the charged particle beam and the center of the strong hexapole.

B2.1. The compact corrector module of paragraph B2, wherein the second voltage is determined selected based on the distance between the crossover of the charged particle beam and the center of the strong hexapole such that one or more of the A2, C3, and D4 aberrations caused by the weak multipole field are combination to the A2, C3, and D4 aberrations caused by the strong multipole field.

B3. The compact corrector of any of paragraphs B1-B2.1, wherein the weak hexapole is at least 50 or 100 times weaker than the strong hexapole.

B4. The compact corrector of any of paragraphs B1-B3, wherein the weak hexapole is positioned within the objective lens when used in the charged particle system.

B5. The compact corrector of any of paragraphs B1-B4, wherein the weak hexapole is positioned within the field of the objective lens.

B6. The compact corrector of any of paragraphs B1-B5, wherein the charged particle microscope is one of a scanning electron microscope (SEM), a scanning transmission electron microscope (STEM), and a transmission electron microscope (TEM).

B7. The compact corrector of any of paragraphs B1-B6, wherein the strong hexapole is an electrostatic hexapole or an electromagnetic hexapole.

B7.1. The compact corrector of paragraph B7, wherein the strong hexapole has a length of at least 5 mm.

B8. The compact corrector of any of paragraphs B1-B7.1, wherein the corrector module is a probe corrector.

B9. The compact corrector of any of paragraphs B1-B8, further including a transfer lens positioned between the strong hexapole and the weak hexapole.

B9.1. The compact corrector of paragraph B9, further including an additional transfer lens positioned downstream of the weak hexapole.

B10. The compact corrector of any of paragraphs B1-B9, wherein the first voltage applied to the strong hexapole is between 50 and 300 kV.

B11. The compact corrector of any of paragraphs B1-B10, wherein the compact corrector module is configured to allow the opening angle of the charged particle beam of the charged particle microscopy to be greater than 20 mrads.

B12. The compact corrector of any of paragraphs B1-B11, further including a condenser lens positioned upstream of the strong hexapole when used in the charged particle system.

B13. The compact corrector of any of paragraphs B1-B12, wherein the compact corrector comprises only one strong hexapole.

C1. An optical corrector module for a charged particle column, the optical corrector module comprising: a split multipole composed of two wafer multipoles separated by a distance less than 100 mm, the individual wafer multipoles comprising: at least two electrodes positioned to partially define a beam path through the wafer multipole, wherein each of the electrodes comprises: a first surface that faces upstream of a charged particle beam when used in the charged particle column; and a second surface that faces downstream of the charged particle beam when used in the charged particle column, wherein the thickness between the first surface and the second surface for each of the electrodes is less than 3 mm.

C1.1. The optical corrector module of paragraph C1, wherein the split multipole is configured to generate a strong multipole field when a first voltage is applied to each of the wafer multipoles.

C1.1.1 The optical corrector module of paragraph C1.1, wherein the two wafer multipoles of the split multiple are separated by a distance of any one of 10 mm, 1 mm, 100 μm, and 10 μm.

C1.2. The optical corrector module of any of paragraphs C1-C1.1.1, wherein the thickness between the first surface and the second surface for each of the electrodes is less than 100 μm.

C1.2.1. The optical corrector module of paragraph C1.2, wherein the thickness between the first surface and the second surface for each of the electrodes is between 1 and 100 μm.

C1.2.2. The optical corrector module of any of paragraphs C1.2 or C1.2.1, wherein the thickness between the first surface and the second surface for each of the electrodes is less than any of 10 mm, 1 mm, 100 μm, and 10 μm.

C1.3. The optical corrector module of any of paragraphs C1-C1.2.2, wherein the distance between the wafer multipoles in the split multipole is less than 20 mm.

C1.4. The optical corrector module of any of paragraphs C1-C1.3, wherein a third surface of each of the electrodes which faces the charged particle beam as it passes through the wafer multipole has a maximum surface roughness of Ra 0.05 μm.

C1.5. The optical corrector module of any of paragraphs C1-C1.4, wherein the individual wafer multipoles are configured to be used with a charged particle beam energy of more than 10 KeV.

C1.6. The optical corrector module of any of paragraphs C1-C1.4, wherein the voltages applied to the wafer hexapoles at between 100V and 300 kV.

C1.7. The optical corrector module of any of paragraphs C1-C1.6, wherein the voltages applied to each of the wafer hexapoles are the same.

C1.8. The optical corrector module of any of paragraphs C1-C1.7, wherein no optical component is positioned between the two wafer multipoles along the charged particle beam path.

C1.9. The optical corrector module of any of paragraphs C1-C1.8, wherein the split multipole is a split hexapole configured to generate a strong hexapole field when a first voltage is applied to each of the wafer multipoles.

C1.9.1. The optical corrector module of paragraph C1.9, wherein each of the wafer multipoles are wafer hexapoles configured to generate a hexapole field when a voltage is applied to each of the wafer hexapoles.

C1.10. The optical corrector module of any of paragraphs C1-C1.9.1, comprising a first transfer lens and a second transfer lens, wherein the first transfer lens is the optical element that is immediately upstream of the split multipole and the second transfer lens is the optical element that is immediately downstream of the split multipole.

C1.10.1. The optical corrector module of paragraph C1.10, wherein the first axial ray applies a focusing effect that causes a crossover of the charged particle beam between the component two wafer multipoles of the split multipole.

C1.10.1.1. The optical corrector module of paragraph C1.10.1, wherein the crossover of the charged particle beam is equidistant to each component wafer multipole.

C1.10.1.2. The optical corrector module of paragraph C1.10.1, wherein the crossover of the charged particle beam is not equidistant to each component wafer multipole.

C2. The optical corrector module of any of paragraphs C1-C1.10, wherein the split multipole is a strong hexapole.

C2.0.1. The optical corrector module of paragraph C2, wherein the optical corrector module is a Crewe style Hexapoles Cs-corrector.

C2.0.2. The optical corrector module of any of paragraphs C2-C2.0.1, wherein and the corrector further comprises a weak hexapole positioned between the strong hexapole and a sample when used in the charged particle column.

C2.1. The optical corrector module of paragraph C2, wherein the split hexapole is positioned such that the crossover of the charged particle beam does not pass through the center of the split hexapole causing the split hexapole field to apply at least an A2 aberration and a D4 aberration to the charged particle beam when used in a charged particle column.

C2.1.1. The optical corrector module of paragraph C2.1, wherein when a second voltage is applied to the weak hexapole it generates a weak hexapole field that applies at least a combination A2 aberration and a combination D4 aberration to the charged particle beam.

C2.1.1.1. The optical corrector module of paragraph C2.1.1, wherein the combined application of the A2 aberration and the combination A2 aberration to the charged particle beam results in the A2 aberration of the charged particle beam being at or near zero at or near the sample plane.

C2.1.1.2. The optical corrector module of any of paragraphs C2.1.1-C2.1.1.1, wherein the combined application of the D4 aberration and the combination D4 aberration to the charged particle beam results in the D4 aberration of the charged particle beam being at or near zero at or near the sample plane.

C2.1.3. The optical corrector module of any of paragraphs C2-C2.1.1.2, wherein the strong hexapole field further applies a C3 aberration to the charged particle beam of the charged particle microscopy system, and the weak hexapole field further applies a combination C3 aberration to the charged particle beam of the charged particle microscopy system.

C2.1.3.1. The optical corrector module of paragraph C2.1.3, wherein the combined application of the C3 aberration and the combination C3 aberration to the charged particle beam results in the C3 aberration of the charged particle beam being at or near zero at or near the sample plane.

C2.2. The optical corrector module of any of paragraphs CA2.1.1-C2.1.3.1, wherein the second voltage is determined selected based on the distance between the crossover of the charged particle beam and the center of the split hexapole.

C2.2.1. The optical corrector module of paragraph C2.2, wherein the second voltage is determined selected based on the distance between the crossover of the charged particle beam and the center of the strong hexapole such that one or more of the A2, C3, and D4 aberrations caused by the weak multipole field are combination to the A2, C3, and D4 aberrations caused by the strong multipole field.

C2.2.2. The optical corrector module of any of paragraphs C2.2-C2.2.1, wherein the weak hexapole is at least 50 or 100 times weaker than the strong hexapole.

C2.3. The optical corrector module of any of paragraphs C2-C2.2.2, wherein the weak hexapole is positioned within the objective lens when used in the charged particle system.

C2.4. The optical corrector module of any of paragraphs C2-C2.3, wherein the weak hexapole is positioned within the field of the objective lens.

C2.5. The optical corrector module of any of paragraphs C2-C2.4, wherein the strong hexapole is an electrostatic hexapole.

C2.6. The optical corrector module of paragraph C2.5, wherein the strong hexapole has a (effective) length of at least 5 mm.

C2.8. The optical corrector module of any of paragraphs C2-C2.7, further including a transfer lens positioned between the strong hexapole and the weak hexapole.

C2.8.1. The optical corrector module of paragraph C2.8, further including an additional transfer lens positioned downstream of the weak hexapole.

C2.9. The optical corrector module of any of paragraphs C2-C9, wherein the first voltage applied to the strong hexapole is between 50 and 300 kV.

C2.10. The optical corrector module of any of paragraphs C2-C2.9, wherein the optical corrector module is configured to allow the opening angle of the charged particle beam of the charged particle microscopy to be greater than 20 mrads.

C2.11. The optical corrector module of any of paragraphs C2-C2.10, further including a condenser lens positioned upstream of the strong hexapole when used in the charged particle system.

C3. The optical corrector module of any of paragraphs C2-C2.11, wherein the corrector further comprises an additional multipole.

C3.1. The optical corrector module of paragraph C3, wherein the additional multipole is a split multipole.

C3.1.1. The optical corrector module of paragraph C3.1, wherein the additional multipole composed of two additional wafer multipoles separated by a distance less than 10 mm, the individual additional wafer multipoles comprising:
  at least two additional electrodes positioned to partially define a beam path through the additional wafer multipole, wherein each of the additional electrodes comprises:
  a first surface that faces upstream of a charged particle beam when used in the charged particle column; and
  a second surface that faces downstream of the charged particle beam when used in the charged particle column, C3.1.2. The optical corrector module of any of paragraphs C3.1-C3.1.1, wherein the thickness between the first surface and the second surface for each of the additional electrodes is less than 3 mm.

C3.1.3. The optical corrector module of any of paragraphs C3.1-C3.1.1, wherein the thickness between the first surface and the second surface for each of the additional electrodes is less than 100 μm.

C3.2. The optical corrector module of any of paragraphs C3-C3.1.3, wherein the additional multipole is positioned downstream of the split multipole when used in a charged particle system.

C3.3. The optical corrector module of any of paragraphs C3-C3.1, wherein the additional multipole is positioned upstream of the split multipole when used in a charged particle system.

C3.4. The optical corrector module of any of paragraphs C3-C3.3, wherein the additional multipole is positioned downstream of the split multipole when used in a charged particle system.

C3.5. The optical corrector module of any of paragraphs C3-C3.4, wherein there are no multipoles positioned between the split multipole and the additional multipole.

C3.6. The optical corrector module of any of paragraphs C3-C3.5, comprising a transfer lens positioned between the split multipole and the additional multipole.

C3.6.1. The optical corrector module of paragraph C3.6, wherein the transfer lens is positioned at an axial crossover of the charged particle beam.

C3.6.2. The optical corrector module of any of paragraphs C3.6-C3.6.1, wherein the axial crossover of the charged particle beam is equidistant to each of the split multipole and the additional multipole.

C3.6.3. The optical corrector module of any of paragraphs C3.6-C3.6.2, wherein the charged particle beam is not a parallel beam when passing through the split multipole when the optical corrector module is used in a charged particle system.

C3.7. The optical corrector module of any of paragraphs C3-C3.5, comprising a first transfer lens and a second transfer lens positioned between the split multipole and the additional multipole.

C3.7.1. The optical corrector module of paragraph C3.7, wherein the first transfer lens is positioned upstream of an axial crossover of the charged particle beam, and the second transfer lens is positioned downstream of an axial crossover of the charged particle beam.

C3.7.2. The optical corrector module of any of paragraphs C3.7-C3.7.1, wherein the axial crossover of the charged particle beam is equidistant to each of the split multipole and the additional multipole.

C3.7.3. The optical corrector module of any of paragraphs C3.7-C3.7.2, wherein the axial crossover of the charged particle beam is equidistant to each of the first transfer lens and the second transfer lens.

C3.7.4. The optical corrector module of any of paragraphs C3.7-C3.7.3, wherein the charged particle beam is a parallel beam when passing through the split multipole when the optical corrector module is used in a charged particle system.

C3.7.5. The optical corrector module of any of paragraphs C3.7-C3.7.3, wherein the charged particle beam is substantially a parallel beam when passing through the split multipole when the optical corrector module is used in a charged particle system.

C3.8. The optical corrector module of any of paragraphs C3-C3.7.5, wherein the split multipole and the additional multipole are both electrostatic multipoles.

C3.9. The optical corrector module of any of paragraphs C3-C3.8, wherein the split multipole and the additional multipole are both hexapoles.

C4. The optical corrector module of any of paragraphs C2-C2.6, wherein the optical corrector module is a probe corrector.

C5. The optical corrector module of any of paragraphs C1-C4, wherein the corrector strength for the optical corrector module corresponds to the relationship:

$$C_{3s} = 4k^2 d^2 \left(L - \frac{2}{3}d\right), \text{ with } k = \frac{3\gamma_r}{2U_r} \frac{V_{hex}}{R^3}.$$

D1. A charged particle system comprising: a sample holder configured to hold a sample; a charged particle source configured to emit a charged particle beam towards the sample; an optical column configured to direct the charged particle beam such that it is incident on the sample, the optical column including an optical corrector module of any of paragraphs C1-C5; and a detector system configured to detect emissions resultant from the sample being irradiated by the charged particle beam.

E1. Use of the corrector module of any of paragraphs A1-A13 and C1-C5.

F1. Use of the charged particle system of any of paragraphs B1-B13 and D1.

What is claimed is:

1. A charged particle system comprising:
    a sample holder configured to hold a sample;
    a charged particle source configured to emit a charged particle beam towards the sample holder;
    an optical column configured to direct the charged particle beam such that it is incident on the sample at the sample holder, the optical column comprising an optical corrector module; and
    a detector system configured to detect emissions resultant from the sample being irradiated by the charged particle beam;
    wherein the optical corrector module comprises:
        a split hexapole composed of two hexapoles separated by a distance less than 100 mm, the individual hexapoles comprising:
            at least two electrodes positioned to partially define a beam path through the hexapole, wherein each of the electrodes comprises:
                a first surface that faces upstream of the charged particle beam when used in the optical column; and
                a second surface that faces downstream of the charged particle beam when used in the optical column; and
        a weak hexapole positioned between the split hexapole and the sample holder,
    wherein the thickness between the first surface and the second surface for each of the electrodes is less than 10 mm, wherein the optical corrector module is arranged such that the split hexapole is a strong hexapole and such that, during operation of the charged particle system, a crossover of the charged particle beam within the split hexapole is not equidistant to each component hexapole of the split hexapole.

2. The charged particle system of claim 1, wherein the split hexapole is configured to generate a strong hexapole field when a voltage is applied to each of the hexapoles, wherein the weak hexapole is configured to generate a weak hexapole field that is weaker than the strong hexapole field, and wherein the charged particle system is configured to apply the same voltages to each of the hexapoles of the split hexapole.

3. The charged particle system of claim 2, wherein the split hexapole is configured to generate the strong hexapole field when the voltage applied to the hexapoles of the split hexapole is between 100V and 300 kV.

4. The charged particle system of claim 1, wherein the thickness between the first surface and the second surface for each of the electrodes is less than 100 µm.

5. The charged particle system of claim 1, wherein the distance between the hexapoles in the split hexapole is less than 20 mm.

6. The charged particle system of claim 1, wherein a third surface of each of the electrodes which faces the charged particle beam as it passes through the hexapole has a maximum surface roughness of Ra 0.05 µm.

7. The charged particle system of claim 1, wherein no optical component is positioned between the two hexapoles of the split hexapole along the charged particle beam path.

8. The charged particle system of claim 1, wherein the two hexapoles of the split hexapole are wafer hexapoles, and the split hexapole comprises a drift space between the wafer hexapoles.

9. The charged particle system of claim 1, wherein the optical corrector module further comprises a first transfer lens and a second transfer lens, wherein the first transfer lens is the optical element that is immediately upstream of the split hexapole and the second transfer lens is the optical element that is immediately downstream of the split hexapole.

10. The charged particle system of claim 1, wherein:
the split hexapole is positioned such that the crossover of the charged particle beam is not located in the center of the split hexapole causing a split hexapole field that is generated by the split hexapole to apply at least an A2 aberration and a D4 aberration to the charged particle beam when used in the optical column; and
the weak hexapole is configured to generate a weak hexapole field that applies at least a combination A2 aberration and a combination D4 aberration to the charged particle beam such that:
the combined application of the A2 aberration and the combination A2 aberration to the charged particle beam results in the A2 aberration of the charged particle beam being at or near zero at or near a sample plane; and
the combined application of the D4 aberration and the combination D4 aberration to the charged particle beam results in the D4 aberration of the charged particle beam being at or near zero at or near the sample plane.

11. The charged particle system of claim 1, wherein the optical corrector module further comprises an additional hexapole.

12. The charged particle system of claim 11, wherein the split hexapole is a first split hexapole, wherein the additional hexapole is a second split hexapole composed of two additional hexapoles separated by a distance less than 100 mm, each individual additional hexapole of the second split hexapole comprising:
at least two additional electrodes positioned to partially define a beam path through the additional hexapole, wherein each of the additional electrodes comprises:
a first surface that faces upstream of the charged particle beam when used in the optical column; and
a second surface that faces downstream of the charged particle beam when used in the optical column, and
wherein the thickness between the first surface and the second surface for each of the additional electrodes is less than 3 mm.

13. The charged particle system of claim 12, wherein there is no hexapole positioned between the first split hexapole and the second split hexapole.

14. The charged particle system of claim 11, wherein the optical corrector module is arranged such that, during operation of the charged particle system, the charged particle beam is not a parallel beam when passing through the split hexapole.

15. The charged particle system of claim 11, wherein the optical corrector module is arranged such that, during operation of the charged particle system, the charged particle beam is a parallel beam when passing through the split hexapole.

16. The charged particle system of claim 11, wherein the split hexapole and the additional hexapole are both electrostatic hexapoles.

17. The charged particle system of claim 1, wherein the optical corrector module is a probe corrector.

18. An optical corrector module for a charged particle column, the optical corrector module comprising:
a split hexapole composed of two hexapoles separated by a distance less than 100 mm, the individual hexapoles comprising:
at least two electrodes positioned to partially define a beam path through the hexapole, wherein each of the electrodes comprises:
a first surface that faces upstream of a charged particle beam when used in the charged particle column; and
a second surface that faces downstream of the charged particle beam when used in the charged particle column; and
a weak hexapole positioned between the split hexapole and a sample holder positioned downstream of the optical corrector module,
wherein the thickness between the first surface and the second surface for each of the electrodes is less than 10 mm, wherein the optical corrector module is arranged such that the split hexapole is a strong hexapole and such that, during operation of the optical corrector module, a crossover of the charged particle beam within the split hexapole is not equidistant to each component hexapole of the split hexapole.

19. The optical corrector module of claim 18, wherein no optical component is positioned between the two hexapoles of the split hexapole along the charged particle beam path.

20. The optical corrector module of claim 18, further comprising a first transfer lens and a second transfer lens, wherein the first transfer lens is the optical element that is immediately upstream of the split hexapole and the second transfer lens is the optical element that is immediately downstream of the split hexapole.

* * * * *